United States Patent [19]

Hagerty

[11] Patent Number: 5,371,479
[45] Date of Patent: Dec. 6, 1994

[54] PRE-AMPLIFIER WITH MULTI-STAGE FEEDBACK

[75] Inventor: James D. Hagerty, Tiverton, R.I.

[73] Assignee: The United States of America as represented by the Secretary of the Navy, Washington, D.C.

[21] Appl. No.: 215,879

[22] Filed: Mar. 22, 1994

[51] Int. Cl.$^5$ .............................................. H03F 1/34
[52] U.S. Cl. ..................................... 330/294; 330/99; 330/100; 330/107
[58] Field of Search ................................. 330/98–100, 330/103, 107, 109, 260, 294

[56] References Cited

U.S. PATENT DOCUMENTS

| | | | |
|---|---|---|---|
| 3,512,102 | 5/1970 | Kubach | 330/100 X |
| 3,863,173 | 1/1975 | Scheib et al. | 330/98 |
| 4,074,204 | 2/1978 | Broburg et al. | 330/109 |

*Primary Examiner*—James B. Mullins
*Attorney, Agent, or Firm*—Michael J. McGowan; Prithvi C. Lall; Michael F. Oglo

[57] ABSTRACT

A circuit for amplifying an input signal comprises an operational amplifier, a dual operational amplifier, and a buffering operational amplifier all cascaded in the aforementioned order. The first operational amplifier amplifies the input signal with minimum noise degradation, is set up as a non-inverting amplifier stage, and has a local negative feedback loop comprising a resistor and capacitor in parallel. The dual operational amplifier has two amplifying devices. One device forms a second amplifying stage which increases the gain of the pre-amplified input signal and has a local negative feedback loop comprising a resistor. The other device is a third operational amplifier which combines with the buffering operational amplifier to form an amplifying and buffering stage. The third operational amplifier connects in series to the output of the second amplifying stage. The buffering operational amplifier connects in series to the output of the third operational amplifier and buffers the amplified signal at this output. The amplifying and buffering stage has a two-stage feedback loop comprising a resistor connected between the output of the buffering operational amplifier and the inverting input of the third operational amplifier. A four-stage feedback loop includes a resistor and capacitor in parallel and connects between the output of the buffering operational amplifier and the inverting input of the first operational amplifier.

20 Claims, 2 Drawing Sheets

PRE-AMPLIFIER WITH MULTI-STAGE FEEDBACK

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The invention relates generally to amplifying circuits and more specifically to an amplifying circuit having a multi-stage, negative feedback loop.

(2) Description of the Prior Art

Nearly every instrument or electronic control system includes an amplifying circuit for strengthening either the transmitted or the received signal of the system. Sonar devices, for example, require amplification of echoes detected by a scanning receiver. Ideally, the amplifying circuit should achieve a high gain in the signal without distortion over a broad range of frequencies. Often, amplifying circuits may require more than one stage of amplification to achieve the desired gain and necessary frequency response.

Multi-stage amplifying circuits may have either an open-loop or a closed-loop architecture. One shortcoming of high-gain open-loop, multistage amplifiers is sensitivity to capacitive coupling and other disturbance signals. Capacitive coupling may be caused by stray capacitance in printed circuit traces or other types of lead wiring. The stray capacitance can produce degraded pulse response and "ringing" from undesired resonances. As a result, open-loop multi-stage amplifiers with large amounts of gain often suffer instability. Other shortcomings of open-loop amplifiers include amplification of the direct-current offset. This amplification reduces signal headroom at the output.

Multistage closed-loop circuits address the shortcomings of open-loop architecture. Such circuits may have local feedback in each stage of amplification. Multistage feedback, however, requires absolute loop stability. Because a stable loop requires compensation of the accumulated phase responses of the individual stages of amplification, multistage feedback is difficult to implement over more than two stages without complex circuitry.

Related art includes U.S. Pat. No. 4,074,204 by Broburg et al. Broburg et al. disclose a multistage amplifier having three operational amplifiers and two segregated passive networks. The passive networks shape different portions of the amplified signal and are not optimized for high gain, low noise or loop stability. Also, Broburg et al. do not mention noise Figure optimization as it relates to gain distribution.

Other related art includes U.S. Pat. No. 3,863,173 by Scheib et al. Scheib et al. disclose a multistage, negative feedback amplifying circuit. The circuit has a group of cascaded amplifiers coupled to one another through filter sections and also has an external direct-current negative feedback loop comprising a feedback resistor connected between the output of the last cascaded amplifier and the inverting input of the first cascaded amplifier. The circuit minimizes the inherent voltage offset of each amplifier, but does not provide any gain.

SUMMARY OF THE INVENTION

Accordingly, an object of the present invention is to amplify an input signal at high gain without compromising stability and transient response.

Another object is to amplify a signal over several stages with large amounts of gain while reducing sensitivity to capacitive coupling and other disturbance signals, as well as component drift.

Yet another object is to stabilize an amplifying circuit against direct current offset.

Still another object is to implement multistage feedback in an amplifying circuit with simple circuitry.

The present invention attains the foregoing and additional objects by providing an amplifying circuit with multi-stage feedback. The circuit comprises a single, low-noise operational amplifier, a dual general-purpose operational amplifier, and a buffering operational amplifier all cascaded together in the aforementioned order. The first operational amplifier forms a first amplifying stage and has an inverting input, a noninverting input, and an output. The noninverting input connects to an input signal which the first operational amplifier amplifies. A first local feedback loop connects between the output and the inverting input of the first operational amplifier. The first local feedback loop includes a resistor and a capacitor connected in parallel.

The dual operational amplifier has two amplifying devices, one of which forms a second amplifying stage having an input and an output. The input of the second stage connects directly to the output of the first amplifying stage. The amplifying device is a second operational amplifier having an inverting input, a noninverting input, and an output. The inverting input of the second operational amplifier connects to a resistor. The resistor connects to the output of the first operational amplifier. The second operational amplifier amplifies the signal from the first operational amplifier. A second local feedback loop connects between the output and the inverting input of the second operational amplifier and includes a resistor.

The other amplifying device of the dual operational amplifier is a third operational amplifier which combines with the buffering operational amplifier to form an amplifying and buffering stage. An input of the amplifying and buffering stage connects directly to the output of the second amplifying stage. Specifically, the third operational amplifier has an inverting input which connects to a resistor, and the resistor connects to the output of the second operational amplifier.

An output of the third operational amplifier connects to an input of the buffering operational amplifier. The buffering operational amplifier has an output which connects to an output terminal through a coupling capacitor. A two-stage feedback loop having a resistor connects between the output of the buffer amplifier and the inverting input of the third operational amplifier.

In accordance with another aspect of the invention, an interstage feedback loop connects between the output of the buffering operational amplifier and the inverting input of the first operational amplifier. The interstage feedback loop includes a resistor and a capacitor connected in parallel.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The foregoing objects and other advantages of the present invention will be more fully understood from the following detailed description and reference to the appended drawings wherein.

DESCRIPTION OF THE PREFERRED EMBODIMENT

Figure 1:
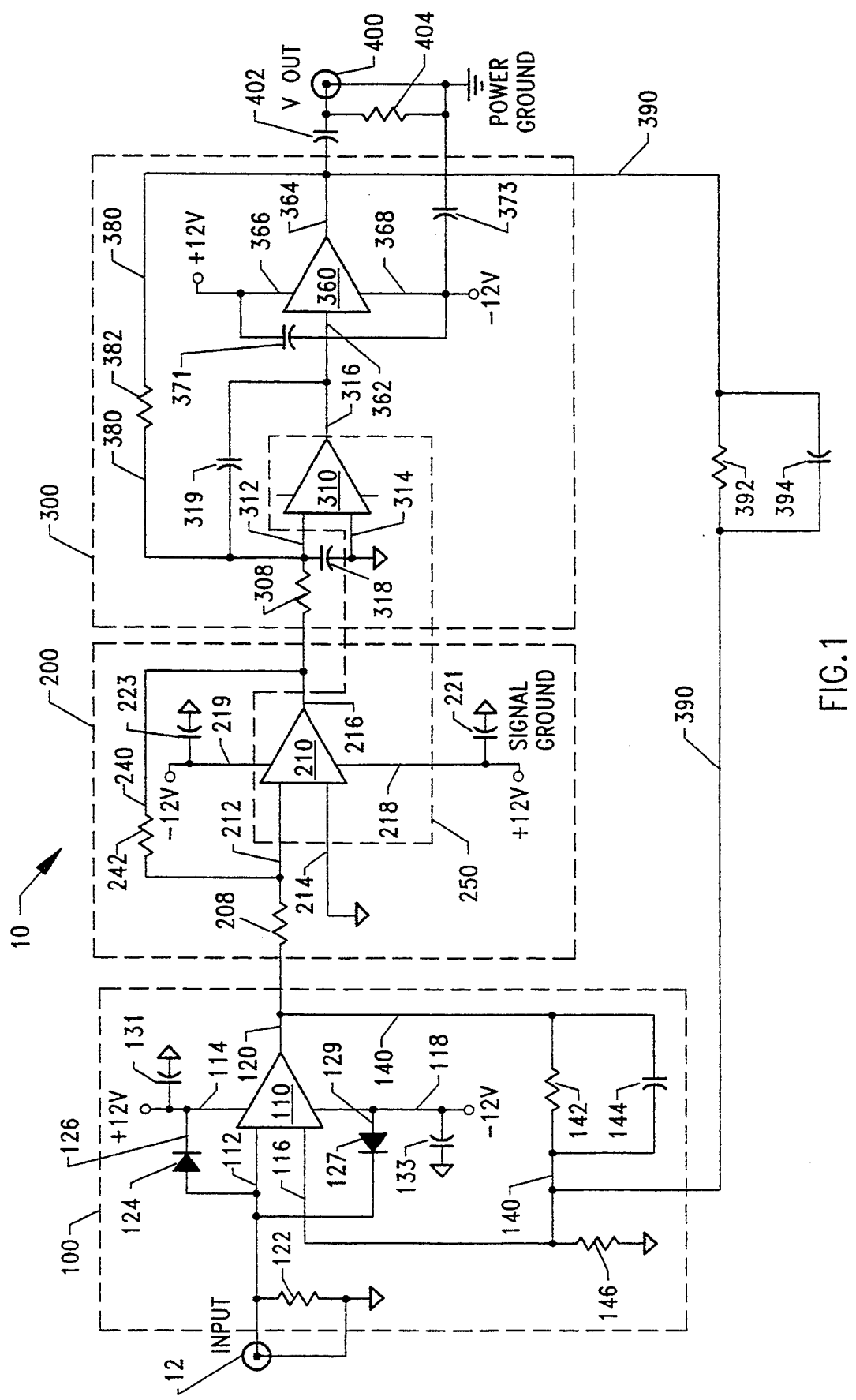
FIG. 1 illustrates an amplifying circuit with multistage feedback in accordance with the present invention.

FIG. 1 illustrates a preamplifier circuit 10 with multistage feedback in accordance with the present invention. The circuit 10 amplifies an input signal 12 and comprises a first amplifying stage 100, a second amplifying stage 200, and an amplifying and buffering stage 300. The circuit 10 separates power ground and signal ground and joins them at one point at the power supply.

The first amplifying stage 100 includes a first low-noise operational amplifier 110 and a first local feedback loop 140. The gain of the first amplifying stage 100 is set at 26 dB. The first operational amplifier 110 has a noninverting input 112, a positive voltage supply line 114, an inverting input 116, a negative voltage supply line 118, and an output 120. Preferably, the operational amplifier 110 is an Analog Devices AD 743 operational amplifier or the like. The input signal 12 connects to the noninverting input 112. A resistor 122 having a resistance of 2 kilohms connects between the noninverting input 112 and ground. A first diode 124 having a cathode 126 connects between the positive voltage supply line 114 and the noninverting input 112 to protect the noninverting input against voltage spikes and transients. Similarly, a second diode 127 having an anode 129 connects between the negative voltage supply line 118 and the noninverting input 112. Both diodes are of a type such as National #FDH300 low-noise diodes or the like. A first capacitor 131 having a capacitance of 0.1 microfarads connects between the positive voltage supply line 114 and ground. A second capacitor 133 having a capacitance of 0.1 microfarads connects between the negative voltage supply line 118 and ground. The positive voltage supply line 114 and negative voltage supply line 118 are at +12 V and −12 V, respectively.

The first local feedback loop 140 connects between the output 120 and the inverting input 116. The loop 140 is a noninverting loop and includes a resistor 142 and a capacitor 144 connected in parallel. The resistor 142 has a resistance of 2.00 kilohms while the capacitor has a capacitance of 560 picofarads. A resistor 146 connects between the inverting input 116 and ground. The resistor 146 has a resistance of 100 ohms.

The output 120 of the first operational amplifier 110 connects to an input of the second amplifying stage 200. Specifically, a resistor 208 having a resistance of 3.01 kilohms connects to the output 120. The second amplifying stage 200 is part of a dual operational amplifier 250 which has two amplifying devices, a second operational amplifier 210 and a third operational amplifier 310. Preferably, the dual operational amplifier is an Analog Devices AD 712 dual general purpose operational amplifier or the like.

The second operational amplifier 210 is configured as a conventional inverting amplifying stage which amplifies the signal appearing at output 120 with a gain of 24 dB. The second operational amplifier 210 has an inverting input 212, a noninverting input 214, an output 216, a positive voltage supply line 218, and a negative voltage supply line 219. The inverting input 212 connects to the resistor 208. The noninverting input 214 connects to ground. The positive voltage supply line 218 and the negative voltage supply line 219 are at +12 Volts and −12 Volts, respectively. A capacitor 221 having a capacitance of 0.1 microfarad connects between the positive voltage supply line 218 and ground. A second capacitor 223 having a capacitance of 0.1 microfarad connects between the negative voltage supply line 219 and ground.

A second local feedback loop 240 includes a resistor 242 having a resistance of 47.5 kilohms. The loop 240 connects between the output 216 and the inverting input 212 of the second operational amplifier 210.

The output 216 of the second operational amplifier 210 connects to an input of the amplifying and buffering stage 300. The amplifying and buffering stage 300 includes a resistor 308, the third operational amplifier 310, and a buffering operational amplifier 360. The resistor 308 has a resistance of 3.01 kilohms and connects to the output 216. The third operational amplifier 310 has an inverting input 312, a noninverting input 314, and an output 316. The inverting input 312 connects to the resistor 308 while the noninverting input 314 connects to ground. A capacitor 318 having a capacitance of 27 picofarads connects between the inverting input 312 and the noninverting input 314. A second capacitor 319 having a capacitance of 120 picofarads connects between the output 316 and the inverting input 312 of the third operational amplifier 310.

The output 316 of the third operational amplifier 310 connects to input 362 of the buffering operational amplifier 360. The buffering operational amplifier 360 is a unity-gain voltage follower. Because the buffering operational amplifier 360 has its location at the output stage, the amplifying circuit 10 of the present invention can drive long cables without any trace of instability.

The buffering operational amplifier 360 has an input 362, an output 364, a positive voltage supply line 366, and a negative voltage supply line 368. Preferably, the buffering operational amplifier 360 is a Linear Technology LT 1010 or the like. The positive voltage supply line 366 is at +12 Volts while the negative voltage supply line is at −12 Volts. A tantalum capacitor 371 having a capacitance of 10 microfarads connects between the positive voltage supply line 366 and the negative voltage supply line 368. The output 364 of the buffering operational amplifier 360 connects to an output terminal 400 through a coupling capacitor 402. A second tantalum capacitor 373 having a capacitance of 10 microfarads connects between the negative voltage supply line 368 and ground.

A two-stage feedback loop 380, also part of the amplifying and buffering stage 300, connects between the output 364 of the buffering operational amplifier 360 and the inverting input 312 of the third operational amplifier 310. The two-stage loop 380 includes a resistor 382 having a resistance of 10 kilohms.

An interstage feedback loop 390 connects between the output 364 of the buffering operational amplifier 360 and the inverting input 116 of the first operational amplifier 110. The interstage feedback loop 390 includes a resistor 392 and a capacitor 394 connected in parallel. The resistor 392 has a resistance of 51.1 kilohms while the capacitor 394 has a capacitance of 33 picofarads.

The capacitor 402 has a value of 1 microfarad. A resistor 404 having a resistance of 10 kilohms connects between the output terminal 400 and ground. The output terminal 400 is alternating-current coupled, although the capacitor 402 may be bypassed if direct-current (d.c.) coupling is desired. D.C. coupling may be accomplished without adverse effects because the d.c. feedback around the four stages compensates the d.c. reference point at the output. This feature minimizes the effects of d.c. offset in the system.

The preamplifier circuit 10 applies feedback between the input and the output of an amplifier over as many stages as possible to achieve improvement in performance characteristics. If the four-stage feedback loop of the circuit 10 is broken, the results would be a 60 dB open-loop amplifier. The feedback network results in 10 dB being fed back to the input to stabilize the circuit 10 against capacitive coupling, component drift, and direct-current offset.

Figure 2:
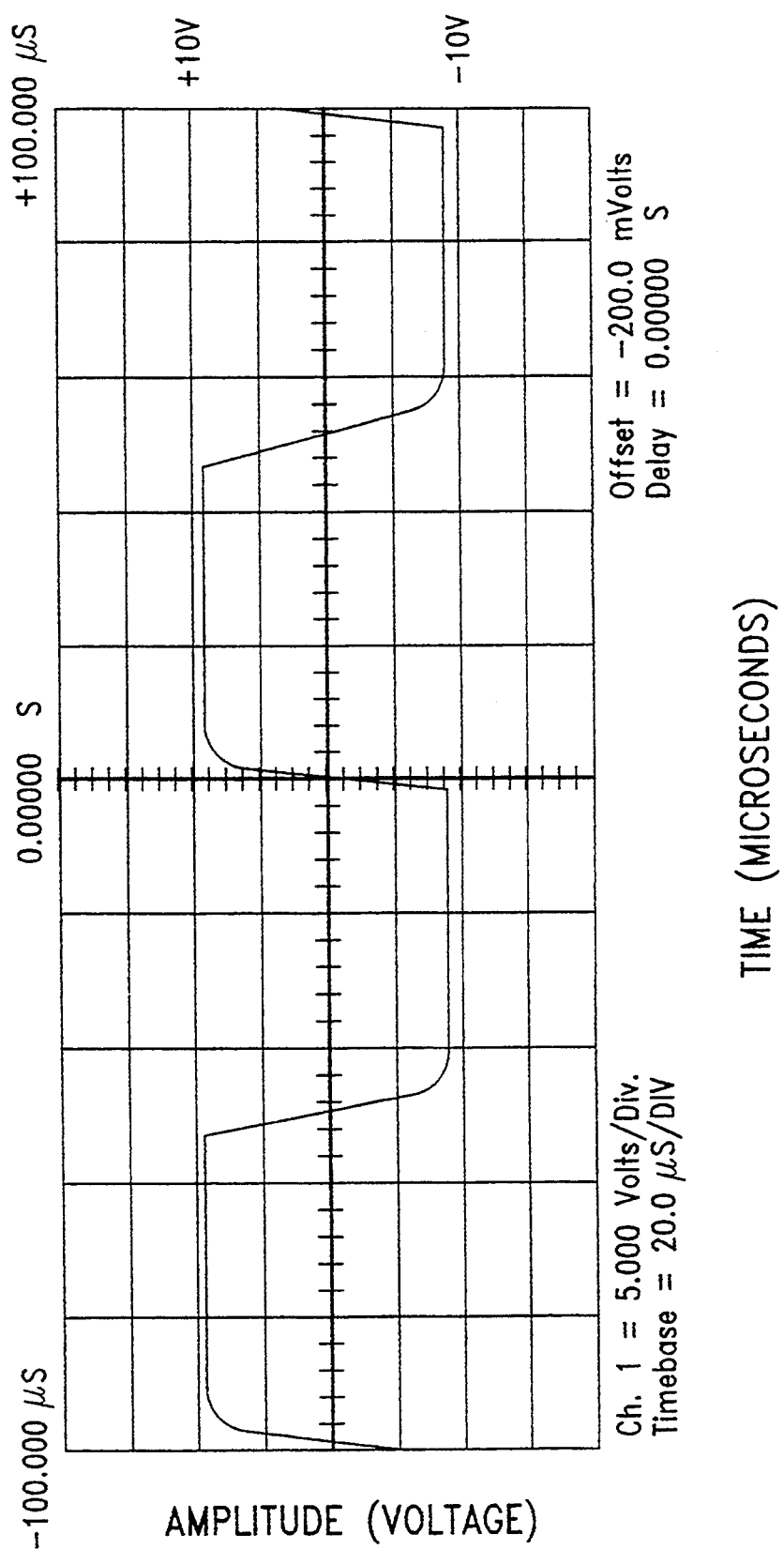
FIG. 2 illustrates a transient response of the amplifying circuit of the present invention for a 10kHz squarewave input.

For the preamplifier circuit 10 as described herein, the phase margin can be calculated at the unity-loop gain frequency of 431 KiloHertz. Accordingly, Phase Margin=(360 (Degrees)—the loop phase shift @431 Khz)=(360−(271))=89 degrees. A phase margin of 89 degrees is quite high and accounts for good transient response. FIG. 2 illustrates the transient response of the circuit 10 for a 10 kHz square-wave input having a 26 mV peak level.

The unique features of this invention include a combination of low-noise operational amplifiers with a buffered output and a four-stage feedback loop. The circuit also uses a minimum of phase compensation networks.

The advantages of the present invention include high gain and accurate transient response around the four-stage loop with few compensation components. Other advantages include cancellation of the effects of direct-current offset, stray-capacitance, and noise or distortion from the output stage. The present invention also compensates against variations in printed-circuit layout.

It is will known in the art that the input impedance of each amplification stage should be kept low enough to prevent noise pickup, yet be kept high enough to allow the succeeding amplification stage to be driven by the previous amplification stage. To accomplish this end, resistors of less than 200 kilohms, but greater than 600 ohms are typically used. Preamplifier circuit 10 as described herein comprises an operational circuit having discrete component values within this range. Other component values can be used provided that the ratios of resistances within an amplification stage are consistent with those indicated and further that the product of the resistances and the capacitances within an amplification stage are also kept consistent with those indicated. The actual gain within each amplification stage will depend on the discrete components chosen.

In typical amplification circuits, resistors are standard 1% metal-film type and tantalum capacitors are chosen for their good rejection of low frequency noise. However, resistors and capacitors consisting of other materials may be used so long as the amount of low frequency noise introduced does not cause instabilities within preamplifier circuit 10.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A circuit for amplifying an input signal, comprising:

first means for amplifying the input signal, said means for amplifying having an inverting input, a noninverting input and an output, the noninverting input being connected to the input signal, said first means for amplifying having a first local feedback loop connected between the output and the inverting input of said first means for amplifying;

second means, connected to the output of said first means for amplifying, for amplifying the amplified input signal, said second means for amplifying having an inverting input, a noninverting input and an output, the inverting input being connected to the output of said first means for amplifying, said second means for amplifying having a second local feedback loop connected between the output and the inverting input of said second means for amplifying;

means, connected to the output of said second means for amplifying, for amplifying and buffering the amplified input signal, said means for amplifying and buffering comprising a third means for amplifying having an inverting input, a noninverting input, and an output, the inverting input connected to the output of said second means for amplifying, said means for amplifying and buffering further comprising means for buffering the amplified signal, the means for buffering having an input and an output, the input of the means for buffering being connected to the output of the third means for amplifying, said means for amplifying and buffering further comprising a two-stage feedback loop connected between the output of the means for buffering and the inverting input of the third means for amplifying; and an interstage feedback loop connected between the output of the means for buffering and the inverting input of said first means for amplifying.

2. A circuit for amplifying an input signal as recited in claim 1 wherein said first means for amplifying includes a low-noise operational amplifier.

3. A circuit for amplifying an input signal as recited in claim 1 wherein the first local feedback loop includes a resistor and a capacitor connected in parallel and a resistor connected between the inverting input of said first means for amplifying and ground.

4. A circuit for amplifying an input signal as recited in claim 1 wherein said first means for amplifying further comprises a low-noise diode connected between a positive voltage supply line and the noninverting input of said first means for amplifying, the low-noise diode having a cathode connected to the positive voltage supply line.

5. A circuit for amplifying an input signal as recited in claim 1 wherein said first means for amplifying further comprises a low-noise diode connected between a negative voltage supply line and the noninverting input of said first means for amplifying, the low-noise diode having an anode connected to the negative voltage supply line.

6. A circuit for amplifying an input signal as recited in claim 1 wherein said first means for amplifying further comprises a resistor connected between the noninverting input of said first means for amplifying and ground.

7. A circuit for amplifying an input signal as recited in claim 1 wherein said second means for amplifying includes an operational amplifier.

8. A circuit for amplifying an input signal as recited in claim 1 wherein the second local feedback loop includes a resistor connected between the inverting input and the output of said second means for amplifying and wherein the noninverting input of said second means for amplifying is connected to ground.

9. A circuit for amplifying an input signal as recited in claim 1 wherein said second means for amplifying further comprises a resistor connected in series from the output of said first means for amplifying to the inverting input of said second means for amplifying.

10. A circuit for amplifying an input signal as recited in claim 1 wherein said second means for amplifying and the third means for amplifying of said means for amplifying and buffering comprise a dual operational amplifier.

11. A circuit for amplifying an input signal as recited in claim 1 wherein the third means for amplifying of said means for amplifying and buffering is an operational amplifier.

12. A circuit for amplifying an input signal as recited in claim 1 wherein said means for amplifying and buffering includes a buffer amplifier.

13. A circuit for amplifying an input signal as recited in claim 1 wherein the two-stage feedback loop includes a resistor connected between the output of the means for buffering and the inverting input of the third means for amplifying.

14. A circuit for amplifying an input signal as recited in claim 1 wherein the noninverting input of the third means for amplifying is connected to ground.

15. A circuit for amplifying an input signal as recited in claim 1 wherein said means for amplifying and buffering further comprises a resistor connected between the output of said second means for amplifying and the inverting input of the third means for amplifying.

16. A circuit for amplifying an input signal as recited in claim 1 wherein said means for amplifying and buffering further comprises a capacitor connected between the output and the inverting input of the third means for amplifying.

17. A circuit for amplifying an input signal as recited in claim 1 wherein said means for amplifying and buffering further comprises a capacitor connected between a positive voltage supply line and a negative voltage supply line of the means for buffering.

18. A circuit for amplifying an input signal as recited in claim 1 wherein said interstage feedback loop includes a resistor and a capacitor connected in parallel.

19. A circuit for amplifying an input signal as recited in claim 1 further comprising an output terminal connected to the output of the means for buffering.

20. A circuit for amplifying an input signal as recited in claim 19 further comprising a capacitor connected between the output of the means for buffering and said output terminal for alternating current coupling.

* * * * *